(12) United States Patent
Maiz

(10) Patent No.: US 6,596,562 B1
(45) Date of Patent: Jul. 22, 2003

(54) SEMICONDUCTOR WAFER SINGULATION METHOD

(75) Inventor: José A. Maiz, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/040,019

(22) Filed: Jan. 3, 2002

(51) Int. Cl.[7] .................. H01L 21/44; H01L 21/48; H01L 21/50
(52) U.S. Cl. .................................... 438/113; 438/463
(58) Field of Search ............................ 438/113, 114, 438/460, 462, 463, 465, 464

(56) References Cited

U.S. PATENT DOCUMENTS 5,637,862 A * 6/1997 Paolella
6,168,311 B1 * 1/2001 Xiao et al.
6,399,463 B1 * 6/2002 Glenn et al.

OTHER PUBLICATIONS

U.S. patent application Ser. No. 09/997,086, Mulligan et al., Not Yet Published.

* cited by examiner

*Primary Examiner*—Phuc T. Dang
(74) *Attorney, Agent, or Firm*—Blakely, Sokoloff, Taylor & Zafman LLP

(57) ABSTRACT

Layers of a processed semiconductor wafer are ablated with laser light from a laser gun. A $CO_2$ laser gun is used, which creates laser light in a wavelength in the 9 to 11 $\mu m$ range. The layers all have absorption coefficients that are relatively high when radiated by laser light having such a wavelength. Silicon of the wafer is, however, relatively transparent to laser light having such a wavelength. A trench is thereby formed in the layers, which prevents damage to the layers when the silicon is subsequently sawed.

29 Claims, 3 Drawing Sheets

SEMICONDUCTOR WAFER SINGULATION METHOD

BACKGROUND OF THE INVENTION

1. Field of the Invention

This invention relates to a method whereby a semiconductor wafer is singulated into individual dies.

2. Discussion of Related Art

Integrated circuits are usually formed in and on silicon and other semiconductor wafer substrates. One substrate typically carries an array of integrated circuits. Each integrated circuit may include millions of electronic semiconductor components, such as transistors, capacitors, diodes, etc. The integrated circuits further include alternating metal lines and dielectric layers formed on the silicon substrate. The metal lines interconnect the electronic components with one another, and provide communication between the electronic components and terminals on the layers. The dielectric layers isolate the metal lines electrically from one another.

A wafer which is processed to include such integrated circuits is subsequently "singulated" or "diced" into individual dies, each die carrying a respective one of the integrated circuits. A saw is typically used to cut in x- and y-directions through scribe streets between the integrated circuits.

The layers of the integrated circuits overlap the scribe street, so that the saw has to be directed through the layers. Previously, the layers were made of mechanically strong dielectric materials such as $SiO_2$ and fluorinated silica glass. These materials were sufficiently strong to prevent cracking into the integrated circuits when being sawed. More recently, the dielectric layers have been made of low K-value (low electric permitivity) dielectric materials. These low K-value dielectric materials are much weaker, and cracks propagate easily from the saw through these materials into the integrated circuits.

BRIEF DESCRIPTION OF THE DRAWINGS

The invention is described by way of examples with reference to the accompanying drawings, wherein.

DETAILED DESCRIPTION OF THE INVENTION

Throughout the following description, specific details are set forth in order to provide a more thorough understanding of the invention. However, the invention may be practiced without these particulars. In other instances, well-known elements have not been shown or described in detail to avoid unnecessarily obscuring the present invention.

Figure 1:
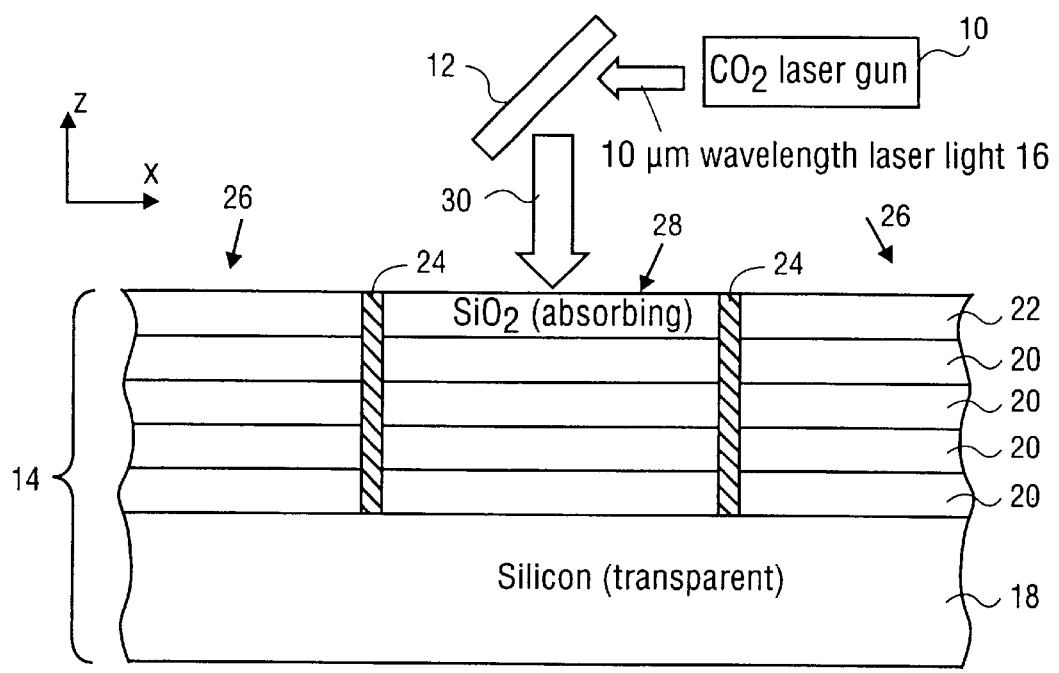
FIG. 1 is a cross-sectional side view illustrating a $CO_2$ laser gun, which is used to ablate the layers of a processed semiconductor wafer.

FIG. 1 of the accompanying drawings illustrates a $CO_2$ laser gun 10 which, together with beam-shaping optics 12, is used to ablate layers of a processed semiconductor wafer 14, to singulate the wafer 14 into individual dies according to the invention. The $CO_2$ laser gun creates laser light 16 at a wavelength in the range of 9 to 11 $\mu$m. For purposes of further discussion, the wavelength of the $CO_2$ laser gun is assumed to be 10 $\mu$m. As will be discussed hereinafter, the wavelength of the laser light 16 is ideally suited to ablate the layers, but not silicon, of the wafer 14. A trench is thereby created in the layers which prevents damage to the layers when the wafer 14 is subsequently sawed.

The wafer 14 includes a silicon (semiconductor material) substrate 18 in which semiconductor electric elements (not shown), such as transistors, capacitors, etc., are formed. A number of layers 20 are then formed on the silicon substrate 18. The layers 20 include alternating metal and dielectric layers. A top layer 22 of $SiO_2$ is formed on the layers 20 for purposes relating to mechanical strength. In another embodiment, the layer 22 may be fluorinated silica glass. Some of the layers 20 are low K-value dielectric layers that are relatively weak mechanically, but desirable because of their electrical properties. Other ones of the layers 20 are layers of metal lines between the dielectric layers. Guard rings 24 are formed in the layers 20 and 22. Each guard ring 24 surrounds a respective integrated circuit 26 formed by the electric components and the layers 20 and 22. A scribe street 28 is defined between the guard rings 24.

The beam-shaping optics 12 shape the laser light 16, and direct the laser light 16 as a beam 30 onto on an upper surface of the scribe street 28. The light from the beam 30 is absorbed by each one of the layers 22 and 20. The respective layer 22 or 20 is ablated after absorbing the light. A respective layer 22 or 20 is more easily ablated, the more absorbent it is to the light.

The following table lists absorption coefficients of the layers 22 and 20 and of the silicon substrate 18 when radiated by laser light having a wavelength of 355 nm and 10 $\mu$m, respectively.

| Material | 355 nm Absorption coefficient (cm$^{-1}$) | 10 $\mu$m Absorption coefficient (cm$^{-1}$) | Notes |
|---|---|---|---|
| Silicon | 1.07E + 06 | 1.00E + 00 | Key layer |
| $SiO_2$ | 0.00E + 00 | ~1E4 | Key layer |
| $SiO_xF_y$ | | Expect high | Key layer |
| Cardon doped Silica | 1.06E + 03 | Expect high | Key layer |
| $Si_3N_4$ (passivation) | 2.48E + 03 | | |
| Polyimide (passivation) | | | |
| $Si_xN_y$ (Etch stop layer) | 1.72E + 04 | | |
| SiC (Etch stop layer) | 4.60E + 03 | 6.00E + 03 | |
| Cu | | | |

A higher absorption coefficient indicates that the light is more easily absorbed and the particular material is then more easily ablated. It can be seen from the table that $SiO_2$ (layer 22) has a relatively high absorption coefficient when radiated by laser light having a reference of 10 $\mu$m, and is relatively transparent when radiated with laser light at a wavelength of 355 nm. Specific absorption coefficients at 10 $\mu$m laser light are not available for all the layers 20. It has been found that they are easily ablated with 10 $\mu$m laser light, and for that reason it is believed that their absorption coefficients of 10 $\mu$m laser are all at least 1E+03 cm$^{-1}$.

What should also be noted is that silicon is relatively transparent at 10 $\mu$m laser light. Relatively little damage will occur to the silicon substrate 18. In comparison, it can also be noted that silicon is relatively absorptive, and $SiO_2$ is relatively transparent at laser light of 355 nm.

Laser light at 10 μm will thus ablate all the layers 22 and 20 without causing ablation or damage to the silicon substrate 18. The wavelength of the laser light is preferably between 9 and 11 μm, the wavelengths of a $CO_2$ laser gun, although it is believed that a laser with a wavelength of at least 4.5 μm and larger will ablate all the layers in the table above, without significant damage to the silicon substrate 18.

Figure 2:
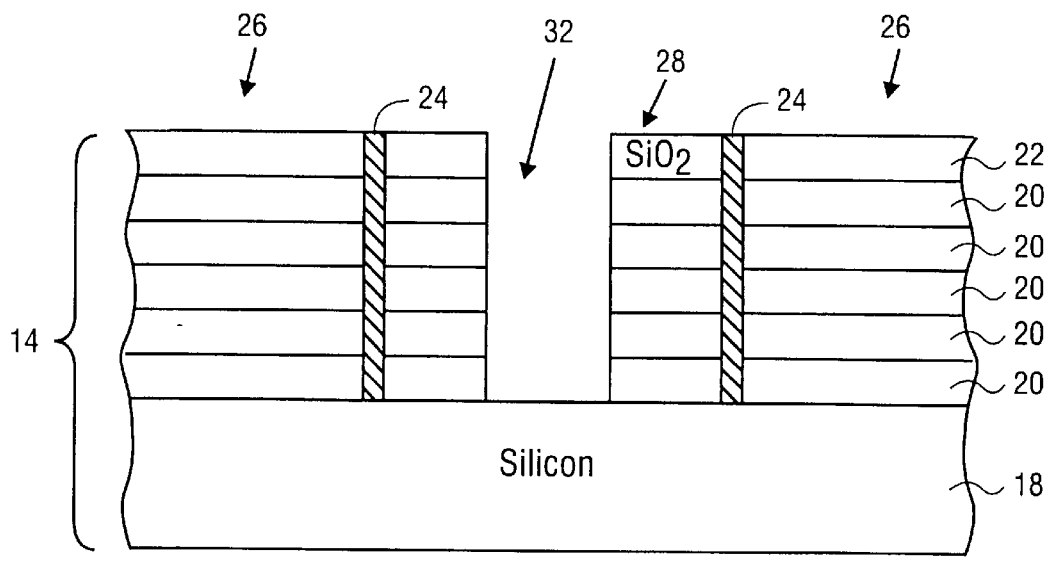
FIG. 2 is a view similar to FIG. 1, after the laser gun forms a trench in the layers.

FIG. 2 illustrates the wafer 14 of FIG. 1 after portions of the layers 20 and 22 have been ablated. A trench 32 is thereby formed in the scribe street 28. The trench 32 has a vertical depth in a z-direction of between 5 and 20 μm, and a width in an x-direction of between 10 and 150 μm. The trench 32 extends all the way down through the layers 22 and 20, and terminates against the silicon substrate 18.

Figure 3:
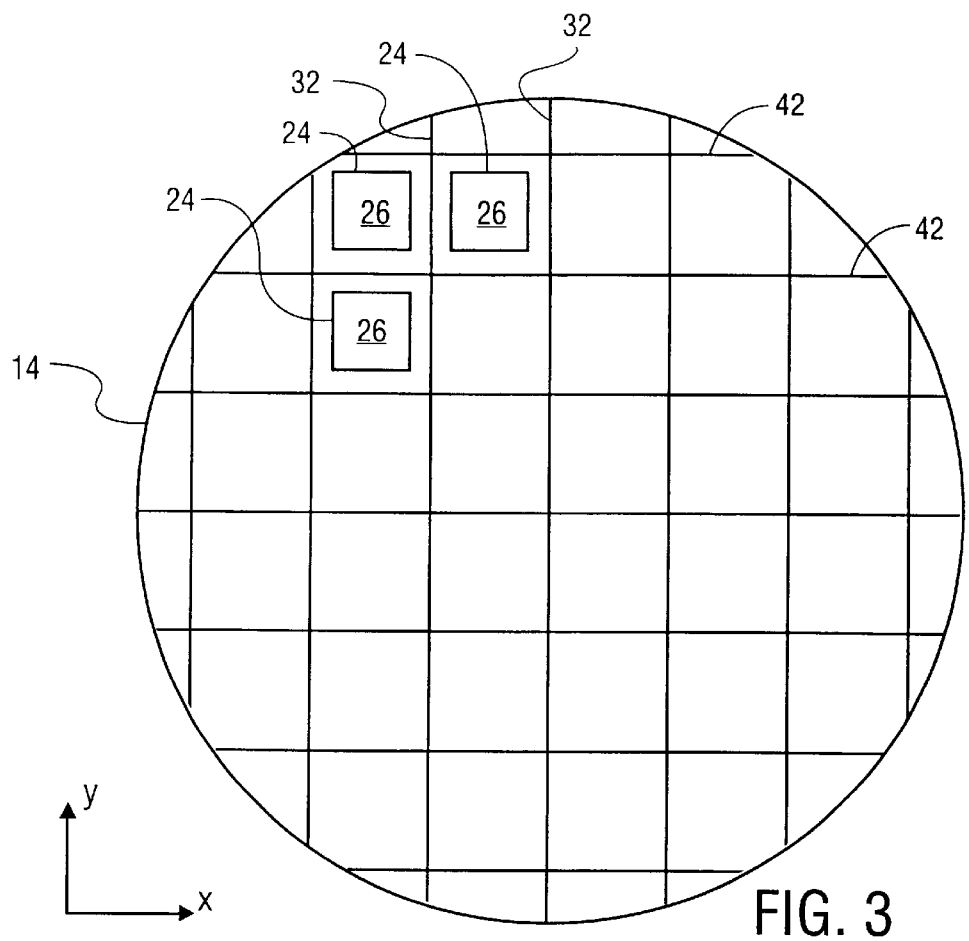
FIG. 3 is a plan view of the wafer, further illustrating additional trenches formed therein.

As can be seen in FIG. 3, an x-y array of integrated circuits 26 is formed as part of the wafer 14. The wafer 14 is moved relative to the beam-shaping optics 12 of FIG. 1 to form a plurality of trenches 32, and more trenches 42. The trenches 32 extend in a y-direction and are spaced in an x-direction relative to one another, and the trenches 42 extend in an x-direction and are spaced in a y-direction relative to one another. Four trenches are so formed on different sides of each integrated circuit 26.

Figure 4:
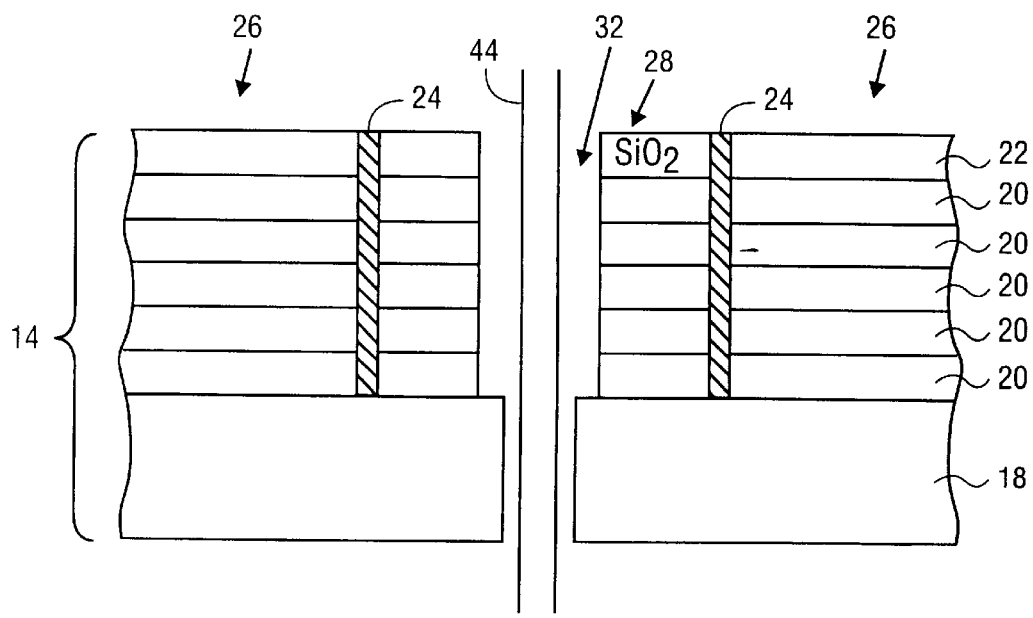
FIG. 4 is a view similar to FIG. 2, illustrating sawing of a silicon substrate of the wafer.

As illustrated in FIG. 4, a saw 44 is then used to cut through the silicon substrate 18 in a region below the trench 32. The saw 44 does not cut through the layers 20 and 22, so that no damage occurs to the layers 20 or 22. The saw 44 is repeatedly used to cut through the silicon below each one of the trenches 32 and 42 in FIG. 3. The wafer 14 is so singulated into individual dies, each die carrying a respective one of the integrated circuits 26.

Figure 5:
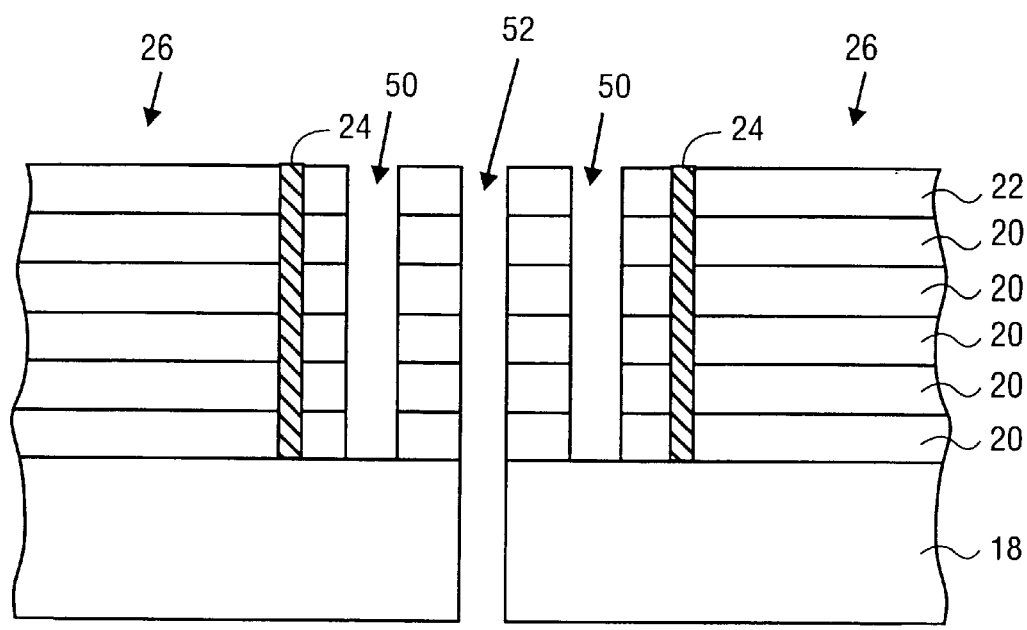
FIG. 5 is a cross-sectional side view of a wafer in which trenches are formed according to another method of the invention.

Damage to the layers 20 and 22 may also be avoided as illustrated in FIG. 5. A $CO_2$ laser gun is used to form two trenches 50 between the guard rings 24. A saw is then used to cut a groove 52 through the layers 20 and 22 between the trenches 50 and through the silicon substrate 18. The trenches 50 isolate the saw from the integrated circuits 26. The trenches 50 do not have to be as wide as shown as FIG. 2, which allows for the use of a more concentrated beam of laser light.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A semiconductor wafer singulation method comprising:
    generating a beam of laser light having a wavelength of at least 4.5 μm; and
    forming a trench into a scribe street between adjacent integrated circuits of a processed semiconductor wafer by directing the beam onto the scribe street, the wafer including a substrate of semiconductor material and a plurality of layers formed on the semiconductor material, all the layers up to the substrate having absorption coefficients of at least 1E+03 cm$^{-1}$ at the wavelength of the laser light, and one of the layers having an absorption coefficient of less than 1E+01 cm$^{-1}$ of laser light having a wavelength of 355 nm.

2. The method of claim 1 wherein semiconductor material of the substrate has an absorption coefficient of less than 1E+02 cm$^{-1}$ at the wavelength of the laser light.

3. The method of claim 2 wherein the semiconductor material is silicon.

4. The method of claim 2 wherein the semiconductor material has an absorption coefficient of at least 1E+05 cm$^{-1}$ of laser light having a wavelength of 355 nm.

5. The method of claim 1 wherein one of the layers is $SiO_2$ or fluorinated silica glass.

6. The method of claim 1 wherein the wavelength of the laser light is between 9 and 11 μm.

7. The method of claim 1, further comprising:
    separating the substrate between the integrated circuits.

8. The method of claim 7 wherein the substrate is separated by sawing the substrate.

9. The method of claim 1, further comprising:
    forming three additional trenches on different sides of one of the integrated circuits.

10. The method of claim 1 wherein the beam is generated using a $CO_2$ laser gun.

11. A semiconductor wafer singulation method, comprising:
    generating a beam of laser light using a $CO_2$ laser gun; and
    forming a trench into a scribe street between adjacent integrated circuits of a processed semiconductor wafer by directing the beam onto the scribe street.

12. The method of claim 11 wherein the wafer includes a substrate of semiconductor material and a plurality of layers formed on the semiconductor material, and all the layers up to the substrate have absorption coefficients of at least 1E+03 cm$^{-1}$ at a wavelength of the laser light.

13. The method of claim 12, further comprising:
    separating the substrate between the integrated circuits.

14. A semiconductor wafer singulation method, comprising:
    generating a beam of laser light; and
    forming a trench into a scribe street between adjacent integrated circuits of a processed semiconductor wafer by directing the beam onto the scribe street, the wafer including a substrate of a semiconductor material having a relatively low absorption coefficient at a wavelength of the laser light, and a plurality of layers on the substrate, all of which having absorption coefficients that are relatively high at the wavelength of the laser light.

15. The method of claim 14 wherein the semiconductor material has an absorption coefficient of less than 1E+02 cm$^{-1}$ at the wavelength of the laser light.

16. The method of claim 15 wherein the semiconductor material is silicon.

17. The method of claim 14 wherein one of the layers is $SiO_2$ or fluorinated silica glass.

18. The method of claim 14 wherein the semiconductor material is silicon and one of the layers is $SiO_2$.

19. The method of claim 14 wherein the beam of laser light has a wavelength of at least 4.5 μm.

20. The method of claim 19 wherein the wafer includes a substrate of semiconductor material and a plurality of layers formed on the semiconductor material, and all the layers up to the substrate have absorption coefficients of at least 1E+03 cm$^{-1}$ at the wavelength of the laser light.

21. The method of claim 20 wherein the semiconductor material has an absorption coefficient of less than 1E+02 cm$^{-1}$ at the wavelength of the laser light.

22. The method of claim 21 wherein the semiconductor material is silicon.

23. The method of claim 21 wherein the semiconductor material has an absorption coefficient of at least $1E+05$ cm$^{-1}$ of laser light having a wavelength of 355 nm.

24. The method of claim 20 wherein one of the layers is SiO$_2$ or fluorinated silica glass.

25. The method of claim 20 wherein one of the layers has an absorption coefficient of less than $1E+01$ cm$^{-1}$ of laser light having a wavelength of 355 nm.

26. The method of claim 19 wherein the wavelength of the laser light is between 9 and 11 $\mu$m.

27. The method of claim 20, further comprising:

separating the substrate between the integrated circuits.

28. The method of claim 27 wherein the substrate is separated by sawing the substrate.

29. The method of claim 19, further comprising:

forming three additional trenches on different sides of one of the integrated circuits.

* * * * *